(12) United States Patent
Ray (10) Patent No.: US 11,626,169 B1
(45) Date of Patent: Apr. 11, 2023

(54) SYSTEMS AND METHODS FOR SENSING RADIATION USING FLASH MEMORY

(71) Applicant: Biswajit Ray, Huntsville, AL (US)

(72) Inventor: Biswajit Ray, Huntsville, AL (US)

(73) Assignee: Board of Trustees of the University of Alabama, for and on behalf of The University of Alabama in Huntsville, Huntsville, AL (US)

( * ) Notice: Subject to any disclaimer, the term of this patent is extended or adjusted under 35 U.S.C. 154(b) by 0 days.

(21) Appl. No.: 17/560,925

(22) Filed: Dec. 23, 2021

Related U.S. Application Data (63) Continuation of application No. 17/118,135, filed on Dec. 10, 2020, now Pat. No. 11,238,943, which is a continuation of application No. 16/415,588, filed on May 17, 2019, now Pat. No. 10,878,922, which is a continuation-in-part of application No. 15/717,598, filed on Sep. 27, 2017, now Pat. No. 10,509,132.

(60) Provisional application No. 62/672,987, filed on May 17, 2018.

(51) Int. Cl.
*G11C 16/26* (2006.01)
*G11C 16/34* (2006.01)
*G11C 16/14* (2006.01)

(52) U.S. Cl.
CPC ............ *G11C 16/26* (2013.01); *G11C 16/14* (2013.01); *G11C 16/3418* (2013.01)

(58) Field of Classification Search
CPC .......... G01T 1/026; G01T 1/00; G01T 16/14; G01T 16/3418; G11C 16/26; G11C 16/349
See application file for complete search history.

(56) References Cited

U.S. PATENT DOCUMENTS

| | | | |
|---|---|---|---|
| 7,491,948 B2 | 2/2009 | Gordon et al. | |
| 9,530,512 B2* | 12/2016 | Ray .................... | G11C 16/3418 |
| 9,543,028 B2 | 1/2017 | Ray et al. | |
| 9,705,320 B1 | 7/2017 | Petrick | |
| 10,509,132 B1 | 12/2019 | Ray et al. | |
| 10,878,922 B1 | 12/2020 | Ray | |
| 2004/0041197 A1 | 3/2004 | Jong et al. | |
| 2004/0191989 A1 | 9/2004 | Ngo | |

(Continued)

OTHER PUBLICATIONS

Irom, et al, "Single Event Effect and Total Ionizing Dose Results of Highly Scaled Flash Memories," Radiation Effects Data Workshop (REDW), 2013 IEEE, pp. 1-4, Jul. 2013.

(Continued)

*Primary Examiner* — David P Porta
*Assistant Examiner* — Fani Polyzos Boosalis
(74) *Attorney, Agent, or Firm* — Maynard Cooper & Gale, P.C.; Jon E. Holland (57) ABSTRACT

A radiation detection system may include a mobile device having a flash memory. The device may monitor various characteristics of the flash memory to determine when damage to the flash memory has occurred from radiation exposure. The device may associate damage to the flash memory with a radiation dose, and determine a level of radiation to which the memory, and thus the device, has been exposed. The device also may determine a length of time and locations where the radiation exposure has occurred. If the device determines that the level of radiation exposure exceeds a threshold associated with a safe level of radiation exposure for a human user, the device may generate an alert to the user.

17 Claims, 6 Drawing Sheets

(56) References Cited

U.S. PATENT DOCUMENTS

2010/0140488 A1    6/2010  Visconti
2014/0026653 A1    1/2014  Del Signore

OTHER PUBLICATIONS

Wikipedia, "Flash Memory," https://en.wikipedia.org/wiki/Flash_memory, Dec. 13, 2017.
Ray, U.S. Appl. No. 17/118,135, entitled, "Systems and Methods for Sensing Radiation Using Flash Memory," filed Dec. 10, 2020.

* cited by examiner

SYSTEMS AND METHODS FOR SENSING RADIATION USING FLASH MEMORY

CROSS REFERENCE TO RELATED APPLICATION

This application is a continuation of U.S. patent application Ser. No. 17/118,135, entitled "Systems and Methods for Sensing Radiation Using Flash Memory," filed on Dec. 10, 2020, which is herein incorporated by reference. U.S. application Ser. No. 17/118,135 is a continuation of U.S. Pat. No. 10,878,922, entitled "Systems and Methods for Sensing Radiation Using Flash Memory," filed on May 17, 2019, which is herein incorporated by reference. U.S. Pat. No. 10,878,922 claims priority to U.S. Provisional Application No. 62/672,987, entitled "Flash Memory-Based Radiation Sensing" and filed on May 17, 2018, which is incorporated herein by reference. U.S. Pat. No. 10,878,922 is a continuation-in-part of U.S. Pat. No. 10,509,132, entitled "Flash Memory-Based Radiation Sensing" and filed on Sep. 27, 2017, which is incorporated herein by reference.

RELATED ART

Radiation comes from various sources. In some environments, radiation may be found due to the presence of radioactive materials, radiation leakage during operation of equipment with radiation-producing operation or byproducts, prior nuclear events, or otherwise. In addition, the radiation can vary in intensity, and may take various forms, such as x-rays, gamma rays, neutrons, heavy ions or otherwise. Some radiation sources may continuously emit low levels of radiation, while radiation from other sources may be produced more sporadically. In each case, the environment may be exposed to varying degrees and intensities to various types of radiation.

Humans often encounter environments where dangerous levels of radiation may exist. For example, nuclear plant workers may be exposed to radiation if a leak occurs in a barrier of a chamber containing a radioactive material. Emergency responders and hazardous materials personnel may be exposed to radiation during emergency situations, such as when components of a nuclear plant malfunction. Airport security personnel may be exposed to radiation emitted by scanning equipment. Even astronauts may experience radiation during extravehicular activities in space from solar flares, the sun's solar wind, cosmic rays, or otherwise.

Radiation detection across various environments is critical because those exposed to too much radiation can face serious injury or death. Because humans may not generally be able to detect radiation using their own senses, those operating in an environment where they may be at risk of radiation exposure may rely on techniques such as parallel exposure of dosimetry devices (e.g., badges, clothing, signage, etc.) or use of electronic instrumentation specifically configured for radiation detection. However, these existing methods have limited accuracy, do not indicate the type or source of radiation detected or whether the radiation exposure occurred over a short or long period of time, and provide little information beyond the mere existence of radiation levels sufficient to trigger an indication on the dosimetry device or detection by the electronic instrumentation. In addition, equipment for radiation detection may be expensive and may be dedicated solely to the purpose of detecting radiation, requiring use of a standalone detection device. Thus, a need exists for improved radiation detection techniques.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally pertains to systems and methods for sensing radiation based on flash memory. A device having a flash memory may monitor various characteristics of the flash memory to determine when damage to the flash memory has occurred from radiation exposure. The device may associate damage to the flash memory with presence of radiation, and determine a level of radiation to which the memory, and thus the device, has been exposed. The device also may determine a length of time and locations where the radiation exposure has occurred. If the device determines that the level of radiation exposure exceeds a threshold associated with a safe level of radiation exposure for a human user, the device may generate an alert to the user.

Figure 1:
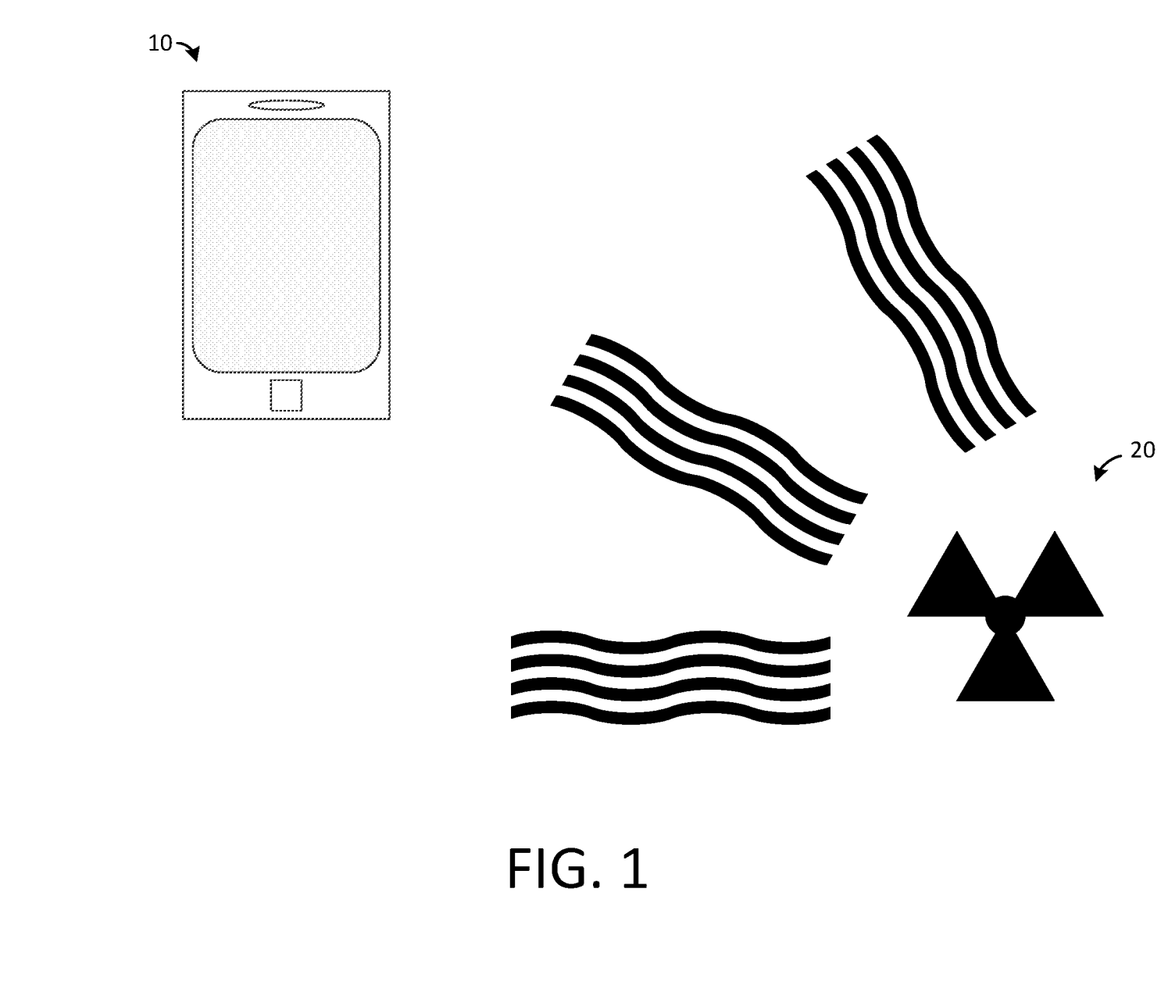
FIG. 1 depicts a front view of a mobile device of a radiation sensing system in accordance with some embodiments of the present disclosure.

FIG. 1 depicts a front view of a mobile device 10 of a radiation sensing system in accordance with some embodiments of the present disclosure. The mobile device 10 of FIG. 1 is depicted as a smartphone using flash memory, such as an iPhone®, Android®, etc., but other mobile devices and different devices using flash memory are possible in other embodiments. Users of such mobile devices often may carry their devices wherever they go. Under some circumstances, a user may use the mobile device 10 while the user is in an environment where the user is exposed to radiation. In this regard, the user's mobile device 10 also may be exposed to radiation.

Note that, although various embodiments described herein may be directed to detection of radiation exposure via flash memory of a mobile device, it will be understood that it is not a limitation of the invention that the device be a mobile device, and that the radiation detection techniques described herein may be implemented using essentially any electronic implementation using flash-based memory structures. It further will be understood that the techniques described herein may be performed using flash memory of various types of electronic devices. For example, in some embodiments, an electronic device may include flash memory configured to function as an "on-chip" radiation detector, such as when the flash memory is integrated with or non-removable with regard to the electronic device. In addition, devices such as laptop computers, desktop computers, displays (e.g., monitors, televisions, etc.), multimedia streaming devices or otherwise, may include components and functionality for performing the radiation detection techniques and steps described herein. In this regard, functionality ascribed to a mobile device may be performed by any or a combination of various types of electronic devices capable of operation using flash memory to perform the radiation sensing techniques described herein.

A radiation source 20 is depicted within the vicinity of the mobile device 10 such that the mobile device 10 is exposed to radiation from the source 20. The radiation source 20 may be various sources of radiation energy, such as radioactive materials, equipment that emits radiation, radioactive weapons, ambient radioactive waves, background radiation, or otherwise. The radiation from the radiation source 20 may be various types of radiation, such as cosmic rays, gamma rays, neutrons, heavy ion strikes, or otherwise.

The mobile device 10 of FIG. 1 may have a flash memory, as described in further detail below. When flash memory is exposed to sufficient amounts of radiation, oxide layers within cells of the flash memory (e.g., dielectric materials associated with each of a cell's control gate and floating gate) may be damaged, and the damage may alter electrical characteristics of the affected flash memory cells, which in turn alters the memory cells' performance. In such instances, the damage may be indicative of exposure of the cell to radiation, including a duration of the exposure, intensity of the exposure, type of radiation, etc. This damage may occur either when the flash memory is exposed to low amounts of radiation for long periods of time, or when the memory experiences a large magnitude radiation dose.

When radiation damages an oxide layer of a flash memory cell, properties of the memory cell may be altered. For example, charge leakage may occur in cells with damaged oxide layers. As a result, a stored state of the cell (e.g., charge on floating gate of the cell) may inadvertently change from a charged state (e.g., bit value 0) to an uncharged state (e.g., bit value 1) without any action from the mobile device 10. Damage to a cell's oxide layers may have other effects on the cell's electrical characteristics, including: lowering a threshold voltage required to perform reading, erasure or programming of the cell; reduction in charge storage time due to increased current leakage from the cell's floating gate; changes to characteristics of data stored in the damaged cell; changes to temperature coefficients of the cell (e.g., coefficients associated with cell temperature variations during reading/erasure/programming operations); reduction in operational speed (e.g., read/erase/program speed); and increased current flow across the damaged cell during standby periods (e.g., between read/erase/program operation) due to leakage paths in oxide layers. Radiation damage to a flash memory cell may be associated with other changes to the cell's characteristics in other embodiments.

Note that the changes to the cell's electrical properties described above may be indicative of the duration, type and intensity of radiation exposure that caused the damage. In this regard, assumptions about such characteristics of the radiation dose that damaged the memory cell may be made. The mobile device 10 may include resources (e.g., a mobile application) for monitoring the memory cell's performance and electrical characteristics and identifying the type of radiation that caused the damage and the duration of the exposure. The mobile device 10 may continuously monitor the memory's performance and, based on the time when damage occurred, may determine a location where the radiation exposure occurred. In this regard, the mobile device 10 may use damage to the flash memory cell to detect various information about radiation, such as radiation levels, type, location, or otherwise and report the information to a user.

Figure 2:
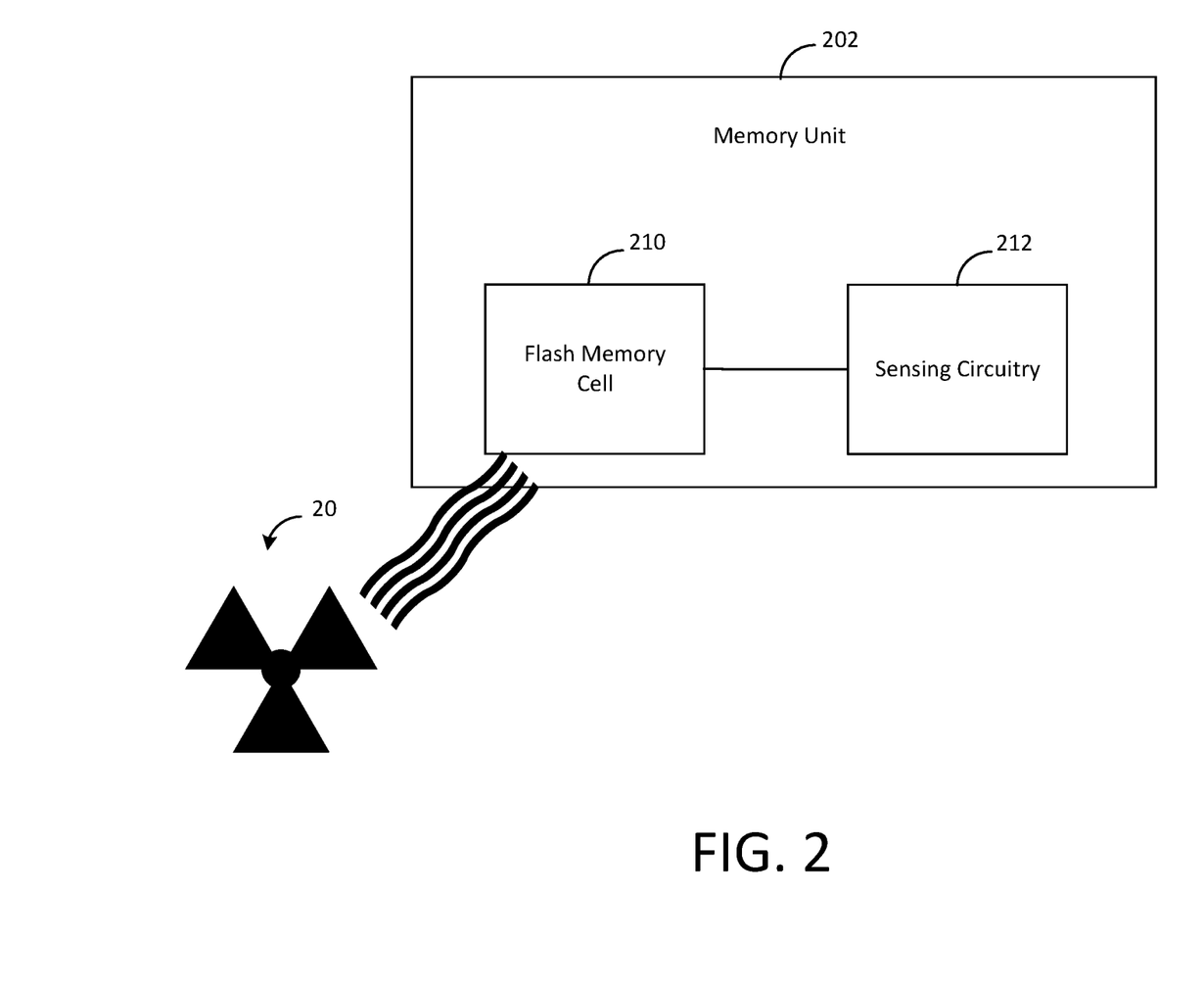
FIG. 2 depicts a memory unit of a radiation sensing system in accordance with some embodiments of the present disclosure.

FIG. 2 depicts a memory unit 202 of a radiation sensing system in accordance with some embodiments of the present disclosure. In some embodiments, the memory unit 202 may include a flash memory 210 and sensing circuitry 212. The sensing circuitry 212 may be coupled to the flash memory 210 for sensing information about the flash memory 210 and providing the information for the resources of the mobile device 10 as described further below. The memory unit 202 may be implemented in various form factors and may comprise various components. In some embodiments, the memory unit 202 may be a removable flash memory device that is capable of coupling to the mobile device 10, such as a card, chip, or otherwise. Memory unit 202 may include other components and perform other functionality ascribed to other components to achieve the functionality described herein.

Flash memory 210 may be various sizes and types of flash memory and may be configured as NOR, NAND, VNAND or other types or arrangements of flash memory. In addition, each cell of memory unit 202 may be configured for storing a desired number of charge states (e.g., bits) per cell, such as single level cell (SLC), multi-level cell (MLC), triple-level cell (TLC) or otherwise. As described further below, flash memory 210 may include additional circuitry (e.g., hardware, etc.) for sensing current, voltage or temperatures of cells of the flash memory 210, such as for monitoring the cells of flash memory 210 and detecting damage to the cells caused by radiation exposure. In some embodiments, a portion of the flash memory 210 may be dedicated for monitoring via sensing circuitry, as described below. In this regard, states of each cell of the portion of the flash memory 210 may be set to a charged state (e.g., logic 0) so that the state will change to an uncharged state (e.g., logic 1) if the cell is damaged and charge leaking occurs. The flash memory 210 further may be configured for performing operations associated with flash memory read, erase and programming functions, as well as other functionality not specifically described herein.

Moreover, as described herein, sensitivity of the flash memory 210 to damaging effects of radiation exposure, and hence, radiation dose detection resolution, may vary based on characteristics of the flash memory 210, such as cell density of the flash memory 210, configuration of flash memory cells (e.g., SLC, MLC, TLC, etc.) or otherwise. For example, sensitivity of systems using flash memory 210 configured as SLC may be limited to detection of high radiation doses (e.g., 10-100 krads, etc.), and may have insufficient resolution or sensitivity for sensing lower radiation doses (e.g., 10-100 rads). Systems using flash memory 210 configured as MLC may be capable of sensing lower doses of radiation than those using SLC flash memory (e.g., 100-1000 rads). Similarly, systems using TLC-configured flash memory 210 may be capable of sensing lower doses than may be sensed by systems using MLC flash memory (e.g., 10-100 rads). Flash memory 210 may be configured as desired for detecting radiation dosage levels, such as based on an expected radiation dose or type, or other suitable information. In some embodiments, the flash memory 210 may be configured as TLC flash memory for detecting radiation doses at or below an amount of radiation absorption that may cause adverse health effects for a human user. Other configurations may have sufficient resolution or sensitivity in other embodiments.

In addition, in some embodiments, states for all or a portion of the memory cell 210 may be set to a programmed or charged state (e.g., logic 0) to allow the radiation sensing described herein to be performed. In this regard, instructions stored in memory of the mobile device 10 may program a desired number of cells (e.g., a number of cells corresponding to a desired memory capacity), such as for achieving a desired memory density for radiation detection. The desired number of cells thus may be assumed to begin with one or more states set to logic 0, such that a number of changes to logic 1 states may be monitored across the cells. In this regard, a number of "bit flips" that occur across the flash memory may be monitored. As noted herein, properties of flash memory may vary with density of the memory, such as sensitivity to radiation exposure, reliability and durability. Further, all or a portion of the flash memory cell 210 may be dedicated for performing radiation sensing operations, and may be unavailable for other uses by the mobile device 10.

Sensing circuitry 212 may include various components for sensing properties of one or more cells of the flash memory 210, including properties such as current, voltage, temperature or other values to be monitored at various times as described herein. The sensing circuitry 212 may be coupled to the flash memory 210 and configured for sensing power provided to a cell flash memory 210 from the mobile device 10. In some embodiments, the sensing circuitry 212 is implemented as one or more complementary metal-oxide-semiconductors (CMOS) and configured to sense current flowing across one or more cells of the flash memory 210. In some embodiments, the sensing circuitry 212 may comprise components for sensing temperature of one or more cells, such as one or more thermistors or otherwise. Sensing circuitry 212 may include other components and be implemented in other manners in order to achieve the functionality described herein. In addition, the sensing circuitry 212 may be configured in various manners to sense current, voltage, or other electrical characteristics present in a cell of the flash memory 210 as part of performing various operations described herein. Sensing circuitry 212 may include various other components not specifically described herein to monitor, detect or otherwise sense the presence of damage to the flash memory 210 that is indicative of radiation exposure or otherwise achieve the functionality described herein.

Figure 3:
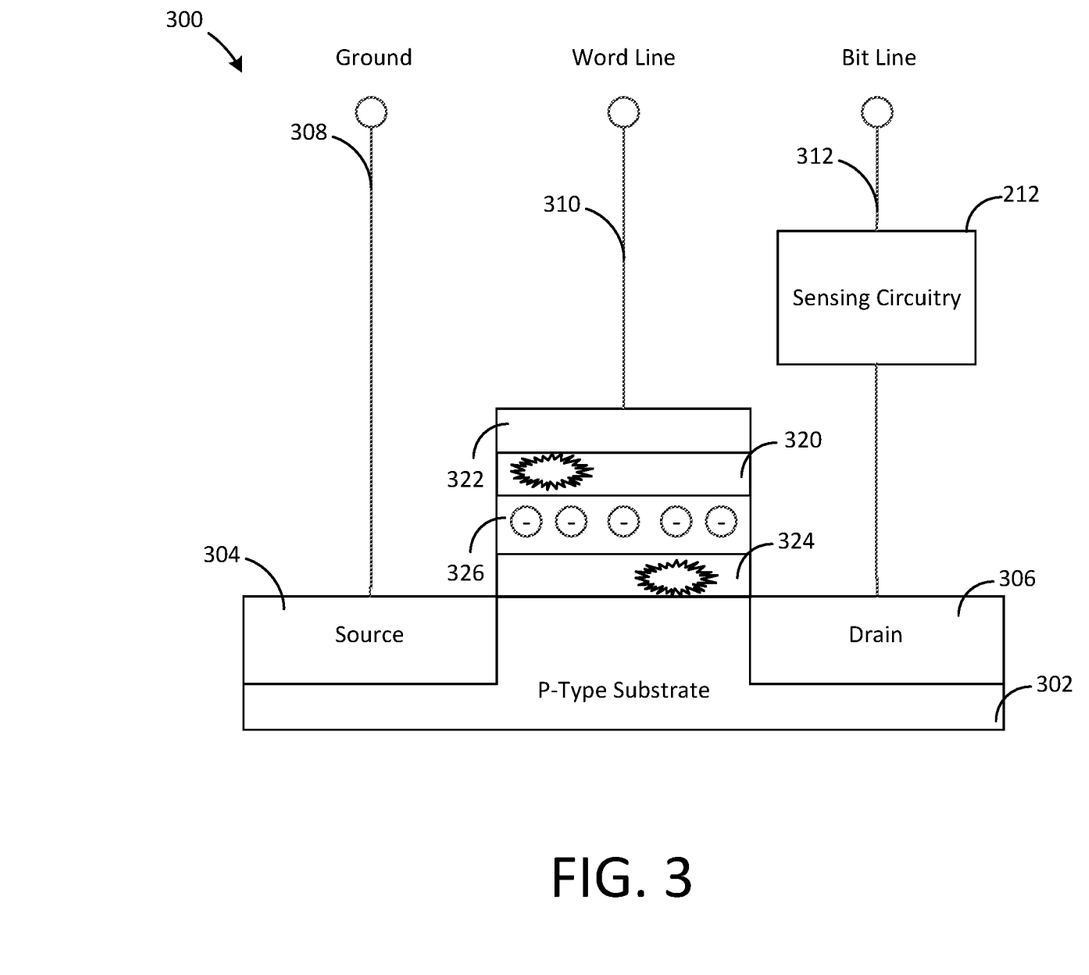
FIG. 3 depicts a memory cell of a radiation sensing system in accordance with some embodiments of the present disclosure.

FIG. 3 depicts a memory cell 300 of a radiation sensing system in accordance with some embodiments of the present disclosure. The memory cell 300 is depicted as one or more flash memory cells such as in flash memory 210, described above. The memory cell 300 of FIG. 3 is depicted as essentially a standard flash memory cell and has a substrate 302, source 304, drain 306, ground line 308, word line 310, and bit line 312. Sensing circuitry 212 is coupled to the bit line 312 for sensing electrical performance of the cell (e.g., voltage, current, etc.). When the cell 300 is exposed to a radiation dose, the dose may cause damage to each of the blocking oxide 420 below the control gate 422 and tunnel oxide 424 below the floating gate 426. The damage may lead to current leakage from a charge stored on the floating gate 426 (e.g., via damage to the oxide layers 420 and 424), which may be detected by the sensing circuitry 212. Voltage may be applied to the cell 300 via the terminals of the cell 300 to perform read/erase/program operations for detecting damage to the cell's oxide layers 420 and 424 as described herein (e.g., with regard to operations described with regard to FIG. 2). The sensing circuitry 212 may be coupled to sense electrical properties of the cell during such operations and may provide a signal indicative of the sensed electrical information for use by the mobile device 10 (e.g., processor 410 when executing radiation sensing application 442 or otherwise). In other embodiments, a cell 300 may comprise other components and be configured according to other techniques in order to achieve the functionality described herein.

Figure 4:
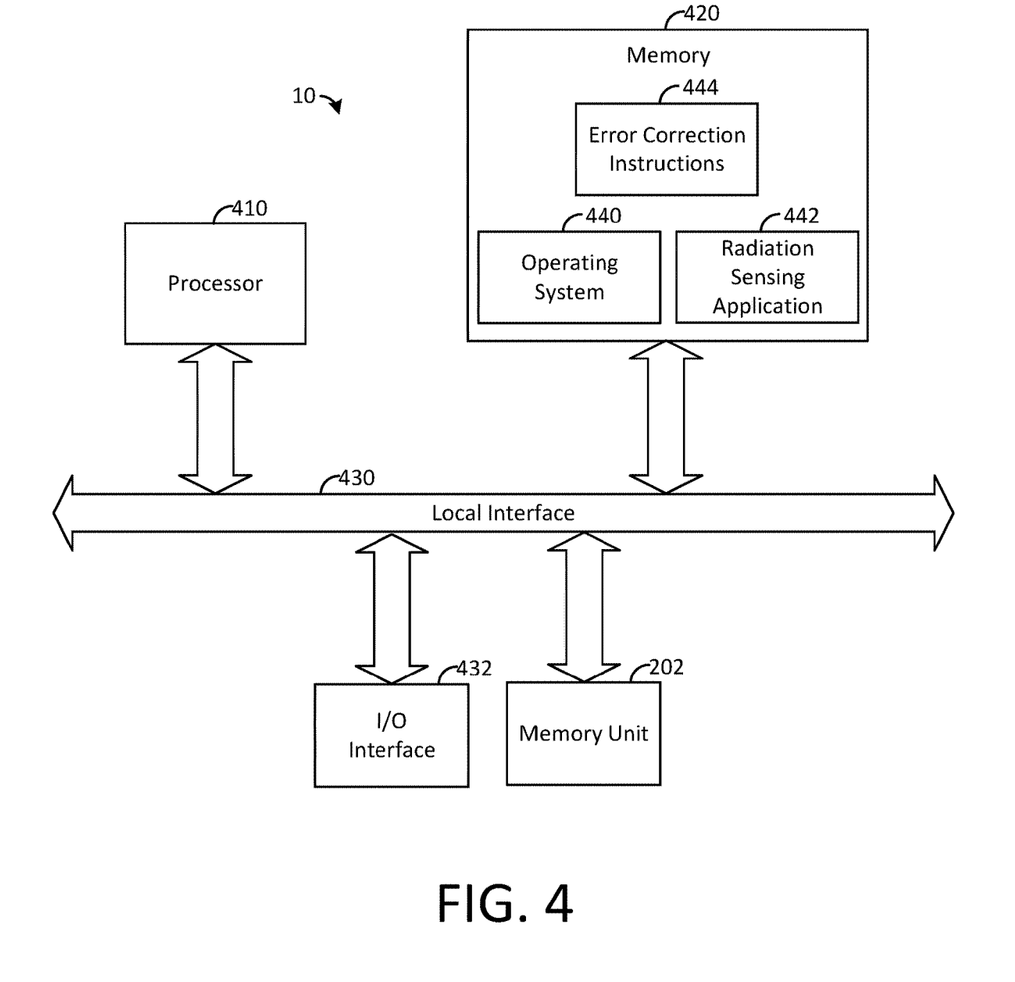
FIG. 4 depicts a block diagram of a mobile device of a radiation sensing system in accordance with some embodiments of the present disclosure.

FIG. 4 depicts a block diagram of a mobile device of a radiation sensing system in accordance with some embodiments of the present disclosure. In some embodiments, the mobile device 10 may include at least one processor 410, memory 420, local interface 430, input/output interface 432, and memory unit 202. The exemplary embodiment of the mobile device 10 depicted by FIG. 4 includes at least one conventional processor 410, which comprises processing hardware for executing instructions stored in the memory 420. As an example, the processor 410 may comprise a central processor (CPU) or a digital signal processor (DSP). The processor 410 communicates to and drives the other elements within the mobile device 10 via a local interface 430, which can include at least one bus.

Memory 420 may be a tangible storage medium. Examples of tangible (or non-transitory) storage medium include disks, thumb drives, hard drives, and other forms of memory. Tangible computer readable storage medium include volatile and non-volatile, removable and non-removable media, such as computer readable instructions, data structures, program modules or other data. Examples of such media include RAM, ROM, EPROM, EEPROM, flash memory, disks or optical storage, magnetic storage, or any other non-transitory medium that stores information.

In some embodiments, input/output interface 432 may comprise various hardware or any combination of hardware and software for receiving inputs from and providing outputs to one or more sources. In some embodiments, input/output interface 432 may comprise a display device for displaying content to a user and an input device for receiving inputs from the user. For example, input/output interface 432 may comprise a touchscreen for displaying a GUI and facilitating communication with a user, such as via capacitative sensing or otherwise. In some embodiments, the input/output interface 432 may be configured for communicating information to a user of the mobile device indicative of radiation detected by the mobile device, such as an alert or report. In addition, input/output interface 432 may include components to enable the mobile device to communicate with other data sources, such as other mobile devices 10, and may include various components (e.g., hardware) and be configured for communication using various protocols and techniques (e.g., Bluetooth, NFC, etc.). Input/output interface 432 may comprise other components in other embodiments.

Memory unit 202 may be a removable unit that is capable of being coupled to and removed from the mobile device 10. As described further below with regard to FIG. 3, the memory unit 202 may comprise various types and quantities of flash memory cells and may be configured according to various techniques. Memory unit 202 also may include sensing circuitry for sensing the flash memory of memory unit 202 (e.g., CMOS, etc.) and providing the sensed information for use by the mobile device 10. Memory unit 202 may include other components in other embodiments.

Operating system 440 may be implemented in software or firmware and may include instructions that, when executed by processor 410, may control execution or operation of various resources of the mobile device 10. Through interfaces of the mobile device 10, processor 410 may execute operating system 440 to control memory unit 202 and execute radiation sensing application 442, receive inputs and provide outputs, such as a GUI or other content to a user via input/output interface 432. Operating system 440 may include other functionality ascribed to software operating systems as may be generally known in the art.

Radiation sensing application 442 may include various instructions for monitoring memory unit 202 to sense alterations in various electrical characteristics of the memory unit 202 that indicate that radiation damage has occurred, determining when damage to the memory unit 202 indicates that the memory unit has been exposed to an amount of radiation that exceeds a threshold, and generating an output indicative of the radiation exposure. Radiation sensing application 442 may do so using information from various sources, such as resources of mobile device 10, measurements and information from sensing circuitry 212, or otherwise. In some embodiments, the application 442 may be received (e.g., downloaded via input/output interface 432 from a data network, the Internet, or otherwise) and stored in memory 420 at the mobile device 10 and may include various other suitable instructions for to monitoring radiation levels to which the mobile device has been exposed based on the memory unit 202. The application 442 may include other instructions, such as for generating and displaying a graphical user interface (GUI) for receiving user inputs and displaying outputs.

Radiation sensing application 442 may include instructions for determining when electrical characteristics of the memory unit 202 indicate that the memory unit has been exposed to an amount of radiation that exceeds a threshold that corresponds to a radiation dose that can cause detectable damage to the flash memory unit 202. As an example, detectable damage may occur at various ranges depending on flash memory type, such as at radiation doses of 10-100 krads for SLC flash memory, 100-10,000 rads for MLC flash memory, or 10-100 rads for TLC flash memory. These exemplary flash memories and other flash memory types may exhibit detectable damage due to radiation doses in other ranges in other embodiments.

The radiation sensing application 442 may include instructions for determining that the memory unit 202 has been exposed to radiation using various techniques, but generally such techniques may involve sensing alterations in various electrical characteristics or performance of the memory unit 202 (e.g., based on information from sensing circuitry described below). Such alterations may be indicative of damage to oxide layers of the cell caused by radiation exposure to the flash memory unit 202. Specifically, when a flash memory cell of the memory unit 202 is exposed to sufficient radiation dose levels or for a sufficient amount of time, current may "leak" from the floating gate of the damaged cell. As noted below, in some embodiments, radiation sensing application 442 may be configured to monitor a number of bit "flips" per byte of flash memory storage capacity as a primary technique for identifying radiation damage, and to perform additional radiation detection techniques described herein for verification or redundancy, or to determine additional information about the radiation.

Exemplary techniques that may be described in instructions comprised within radiation sensing application 442 may include: 1) determining that radiation exposure has occurred based on a number of bit values per byte of memory storage that has changed ("flipped") from charged (e.g., logical 0) to uncharged (e.g., logical 1); 2) determining that a threshold voltage required to perform reading, erasure or programming of the cell has been reduced by an amount greater than a predetermined amount; 3) determining that current leakage from the cell's floating gate has increased such that charge storage time has decreased by an amount of time greater than a predetermined length of time; 4) determining changes to data retention characteristics stored in the damaged cell exceed a predetermined amount of change; 5) determining that changes to temperature coefficients of the cell (e.g., coefficients associated with cell temperature variations during reading, erasure, or programming operations) exceed a predetermined change; 6) determining reduction in operational speed (e.g., read/erase/program speed) has exceeded a reduction amount; and/or 7) determining that current flow across the damaged cell during standby periods (e.g., between read/erase/program operation) has increased due to leakage paths in oxide layers. Each of these techniques may be performed at one or more cells, and may indicate various information about a radiation dose (total ionization dose) to which the cell has been exposed, as described herein. Radiation sensing application 442 may include instructions for sensing radiation based on any individual technique or a combination of such techniques in some embodiments.

Instructions included in radiation sensing application 442 may perform various functions for determining that radiation exposure has occurred based on a number of bit values per unit (e.g., byte, kilobyte, etc.) of flash memory capacity that has fallen below a charge threshold such that its state or bit value has changed or flipped from charged (e.g., logical 0) to uncharged (e.g., logical 1). In some embodiments, all or a portion of memory unit 202 may be allocated for use by radiation sensing application such that cell values should remain charged due to damage from radiation.

For a portion of memory allocated for radiation detection, the radiation sensing application 442 may set cell values to an initial value. The radiation sensing application 442 may then monitor for cell values that change from charged to uncharged due to damage from radiation, such that the cell's bit value "flips". In an exemplary embodiment, memory unit 202 may include a number of cells that may be programmed initially to a charged state or logic 0 bit value. As noted herein, radiation sensing application 442 may include instructions for establishing a "baseline" for monitoring states of cells in the memory unit 202 by programming one or more of the cells (e.g., state value of logic 0). In this regard, charge leakage from the cell may cause the cell to fall below a charge threshold and "flip" from a state of logic 0 to logic 1. When charge (e.g., current) leaks from the cell due to oxide layer damage, the cell may lose charge and eventually fall below the charge threshold; that is, a bit value for the cell may change or "flip" the cell's bit value to a logic 1. A number of bit "flips" per byte may be proportional to or otherwise indicative of radiation damage, such as when the number exceeds a bit error rate (BER) for a size of the memory or other predefined threshold. Radiation sensing application 442 may include instructions for monitoring one or more logic states for each cell and noting when one or more bit values for a number of cells (e.g., bytes) of the memory unit 202 has exceeded the predefined threshold per byte of memory (e.g., when a number of measured bit flips per byte exceeds a BER associated with the size of memory unit 202). When a number of bit "flips" is detected that exceeds the predefined threshold, the radiation sensing application 442 may be configured to determine that radiation exposure has occurred. Note that, in some embodiments, a cell of memory unit 202 may have multiple states (e.g., MLC flash memory, etc.). In such embodiments, bit "flips" for any or a combination of states of one or more cells may be monitored. In addition, radiation sensing application 442 may include instructions for distinguishing between charge loss due to damage caused by radiation and a BER associated with cells of the memory unit 202. As an example, the application 442 may compare a number of bit flips with the BER associated with the memory and, if the number of bit flips exceeds the BER by a predetermined threshold amount, the instructions may be configured to determine that the number of bit flips damage to the cells from radiation exposure has occurred. The increase in number of bit flips detected may be indicative of intensity of a radiation dose, radiation type, or other information. Other techniques may be included in the radiation sensing application 442 in other embodiments.

Instructions included in radiation sensing application 442 may perform various functions for determining that a threshold voltage required to perform reading, erasure or programming of the cell has been reduced by an amount greater than a predetermined amount. Performing operations at cells of the memory unit 202 may involve application of a threshold voltage that corresponds to the operation. For example, application of a voltage of 12V may be required to program a cell (e.g., set a state to logic 0, etc.). A different threshold voltage may be required to read the cell, or to erase the cell. Such voltages may represent thresholds for performing corresponding operations, and may be predefined in advance such that radiation sensing application 442 may monitor voltages required to perform each operation measured over time, such as based on voltages sensed by the sensing circuitry 212. As noted herein, radiation doses may damage a cell's oxide layers, thus altering (e.g., lowering) a threshold voltage required to perform operations at the cell. In some embodiments, radiation sensing application 442 may include instructions for monitoring a threshold voltage for each cell or a plurality of cells of memory unit 202, such as during normal operations of the mobile device 10 or at various other times, such as in response to a request from a user. If a voltage required to perform each or any of reading, erasure or programming operations at the memory unit falls below a threshold voltage, radiation sensing application 442 may be configured to determine that radiation damage to the cell has occurred (e.g., that damage to an oxide layer of the cell has occurred). The reduction in voltage may be indicative of a dose intensity, radiation type, or other information. Other techniques may be included in the application 442 in other embodiments.

Instructions included in radiation sensing application 442 may perform various functions for determining that current leakage from the cell's floating gate has increased such that charge storage time has decreased by an amount of time greater than a predetermined length of time. Flash memory cells, such as in memory unit 202, may be capable of retaining charge storage for long periods of time, such as tens of years, with little current leakage over that time. Cells having damaged oxide layers from radiation doses may exhibit dramatically increased current leakage rates, and in some instances, may quickly begin losing their charge. In this regard, a charge level that falls below an expected charge level within a short amount of time (e.g., hours, days, weeks, etc.) may be indicative of radiation damage at a cell. Radiation sensing application 442 may monitor current leakage by noting a charge of a cell and determining whether that charge is indicative of charge loss that exceeds an expected charge loss amount for a corresponding time period. In particular, charge loss may be measured by the memory unit 202 (e.g., sensing circuitry), such as by performing an erase operation at the cell (e.g., applying voltage to determine an amount of current present on the floating gate) or otherwise. Radiation sensing application 442 may include instructions for determining that the detected increase in current leakage is indicative of information such as dose intensity, radiation type, or other information. Other techniques may be included in the radiation sensing application 442 in other embodiments.

Instructions included in radiation sensing application 442 may perform various functions for determining changes to data retention characteristics of a damaged memory cell exceed a predetermined amount of change. As indicated above, flash memory cells may be capable of retaining charge storage for years. Flash memory that has been damaged by radiation may exhibit high rates of corruption in stored data, such as from significant reductions in data retention time at one or more cells. Radiation sensing application 442 may monitor data retention by noting a length of time one or more cells remains charged (e.g., programmed) and, if a cell loses its charge (e.g., a bit state flips from logic 0 to 1), determining whether that charge loss is indicative of charge loss that exceeds an expected charge loss value for the time period the charge was stored. In particular, data retention may be measured by determining an amount of time a cell at the memory unit 202 has retained the data stored in it and noting whether the cell has retained the data for an amount of time that indicates radiation damage has occurred. The data retention period may be determined by periodically performing a read operation at the cell (e.g., applying voltage to determine an amount of current present on the floating gate) or otherwise. It should be noted that, as an example, a data retention period for a flash memory cell that decreases from a period within a normal retention period range for such memory cell (e.g., years) to a substantially shorter period of time (e.g., weeks or months) may be indicative of damage to the cell from radiation exposure. The change in data retention characteristics may be indicative of a dose intensity, radiation type, or other information. Other data retention periods are possible in other embodiments, and other techniques may be included in the radiation sensing application 442.

Instructions included in radiation sensing application 442 may perform various functions for determining that changes to temperature coefficients of a memory cell (e.g., coefficients associated with cell temperature variations during reading, erasure, or programming operations) exceed a predetermined change. Temperature changes may be indicative of presence of voltage and current in a circuit, such that temperature changes of components of flash memory may vary during use (e.g., from applied voltage, current, etc.). Temperature coefficients may correspond to such changes, and may generally be known for various points in time during the life cycle of the flash memory device. In this regard, coefficients corresponding to expected temperature or temperature change for components of a flash memory device (e.g., memory unit 202) during various operations of flash memory devices may be predefined (e.g., as a result of manufacturer testing or otherwise). Variations to temperatures and temperature changes measured by the sensing circuitry 212 during various operations performed at flash memory cells may be indicative of radiation damage (e.g., when temperate change expected during programming of a cell exceeds a threshold temperature change for the cell due to increased current flow). Thus, temperature coefficients may be altered. Radiation sensing application 442 may include instructions for monitoring a temperatures measured by the sensing circuitry 212 at a cell during each of a read operation, erase operation, program operation, or other operation (e.g., based on information from the sensing circuit of the flash memory unit). The radiation sensing application 442 may determine that information from the memory unit 202 indicates that one or more temperature coefficients at the cell for an operation have changed (e.g., a higher or lower temperature change occurs than expected for an undamaged cell, etc.), and a determination may be made that radiation has damaged the cell. The change in temperature coefficients may be indicative of a radiation dose intensity, duration, radiation type, or other information. Other techniques may be included in the radiation sensing application 442 in other embodiments.

Instructions included in radiation sensing application 442 may perform various functions for determining that a reduction in operational speed (e.g., read/erase/program speed) has exceeded a reduction amount. Flash memory cells damaged by radiation may exhibit slower operating speeds than undamaged units. Thus, reduced operating speed may be indicative of radiation damage. Radiation sensing application 442 may include instructions for monitoring a length of time required for each of a read operation, erase operation, program operation, or other operation at one or more cells of the flash memory unit 202 to be completed (e.g., based on information from the sensing circuit 212 of the flash memory unit). If an amount of time required to complete the operation exceeds a threshold amount of time corresponding to that operation (e.g., a completion time for the process in an undamaged cell), a determination may be made that radiation has damaged the cell. The reduction in operational speed may be indicative of a radiation dose intensity, radiation type, or other information. Other techniques may be included in the radiation sensing application 442 in other embodiments.

Instructions included in radiation sensing application 442 may perform various functions for determining that current flow across the damaged cell during standby periods (e.g., between read/erase/program operation) has increased due to leakage paths in oxide layers. As noted above, current leakage may increase in cells with damaged oxide layers. Mobile device 10 may provide power to the memory unit 202 during periods when only "read" operations are occurring, or that are between other operations at the memory unit 202 (e.g., erase, program, etc.). Radiation sensing application 442 may include instructions for monitoring this "standby" current during such read-only periods at the memory unit 202 using information from sensing circuitry 212. Sensing circuitry 212 may measure and provide information about such leakage to radiation sensing application 442. When an increase in current is measured that exceeds a threshold corresponding to a current value at an undamaged cell, determining that the cell has been exposed to radiation. The increase in current may be indicative of a dose intensity, radiation type, or other information. Other techniques may be included in the radiation sensing instructions 442 in other embodiments.

Radiation sensing application 442 may include instructions for associating a location of the mobile device over time and determining where radiation exposure has occurred. In an embodiment, when a determination that radiation exposure has occurred, the application 442 may associate the location with information about each instance of radiation exposure. In this regard, the radiation sensing application 442 may include instructions for monitoring the location of the mobile device and, when radiation is sensed as described herein, associating the location of the mobile device at the time the radiation was sensed with information about the sensed radiation. In this regard, the location of radiation to which the mobile device has been exposed over time may be monitored for various purposes, such as identification of previously unknown radiation sources. The radiation sensing application 442 may include instructions for receiving location information via various sources, such as resources of the mobile device 10 capable of: sensing the device's location (e.g., via displacement or gyroscopic sensing), receiving location information via global positioning system (GPS), communicating via various protocols, (e.g., Bluetooth, RF, NFC, etc.) to receive location information from other devices (e.g., nodes of a wireless network, beacons, etc.), or otherwise.

Radiation sensing application 442 also may include instructions for generating an output indicative of a radiation dose experienced by the mobile device 10, as described herein. The output may include information about the radiation exposure, such as dose intensity, location, duration, or otherwise, and may be expressed in various units (e.g., rads, sieverts, etc.), type of radiation dose that caused damage to the flash memory unit 202 (X-Rays, Gamma Rays, etc.) or otherwise. The output also may associate detected radiation doses with time and location information sensed and made available via other resources of the mobile device 10. Other information associated with detected radiation may be included in the output generated by radiation sensing application 442 and provided to a user in other embodiments.

Note that, in some embodiments, device 10 may be configured to perform error correction when reading data from memory, such as flash memory unit 202. Mobile devices such as mobile device 10 commonly include instructions or logic (e.g., error correction instructions 444) configured to detect errors when reading data stored in flash memory at the mobile device and to correct the data errors before the data is used for processing. Mobile device 10 may be configured to perform such functionality when processing data from various sources, such as when memory unit 202 comprises any of various formats suitable for error correction functionality, such as a Secure Digital (SD) card, etc. Error correction may be performed for data from other sources in other embodiments.

Error correction instructions 444 are depicted as being implemented in software and stored in memory 420 of FIG. 4, but that the instructions 444 can be located in various memory locations within the device 10. Error correction instructions 444 can include instructions for performing various error correction techniques, such as cyclic redundancy check (CRC), check sum, inclusion of parity bits, or otherwise. Various techniques for performing error correction are possible. It will be apparent to one of ordinary skill upon reading of this disclosure that the techniques for error correction described herein are not the exclusive techniques contemplated for purposes of this disclosure. Instead, such techniques are described merely for exemplary purposes.

As an example of operation of the error correction instructions 444, in some embodiments, a portion of the data stored in flash memory unit 202 may represent data bits with values redundant to the bit values for data stored in a portion of flash memory associated with the redundant bits. In executing the error correction instructions 444, processor 410 may be configured to check bit values read from flash memory against the redundant data bits to identify errors in bit values read from the flash memory. The processor 410 can execute error correction instructions 410 to compare the bit values against an expected bit value indicated by respective redundant bit values and correct (e.g., change) any bits for which an erroneous value has been read. In this regard, error correction instructions 444 can include instructions for mitigating bit values that do not match expected values (e.g., bit flips) before the data is used by the processor 410 to execute additional instructions at the mobile device 10, such as radiation sensing application 442. Thus, data provided for use by radiation sensing application 442 may include corrected bit values for bit flips (e.g., corrected to logic zero) rather than bit values indicative of charge leakage at a cell damaged by radiation exposure (e.g., logic one).

In some embodiments, error correction instructions 444 may determine that an error has occurred if a bit value read for a cell of flash memory differs from one or more of the cell's expected bit values. The expected value can be based on a value indicated by data bits included with a portion of data stored in memory, such as parity or redundancy bits. Data bit values read from each cell can be compared with expected bit values based on the data bits for the respective portion of memory and errors can be identified based on mismatches between expected data bit values and read data bit values.

Execution of error correction instructions 444 may impair detection of bit flips by the radiation sensing application 442. Normally, a comparison by the radiation sensing application 442 of a bit value read from a damaged cell (e.g., erased or logic one) with the initial value (e.g., logic zero) may reveal damaged cells. However, bit values read from the damaged cells may be identified as errors by the error correction instructions 444, and may be corrected to the expected or initial value (e.g., logic zero) before the comparison to detect the damaged cells can be performed by radiation sensing application 442. In some embodiments, error correction performed by error correction instructions 444 may simply be overridden or disabled, such as by the operating system 440, upon request by the radiation sensing application or otherwise. Alternatively, error correction instructions 444 may be configured to identify errors corrected by error correction code and provide the information to the radiation sensing application 442 for comparison as described herein. That is, the radiation sensing application 442 may use information from execution of the error correction instructions to determine which or how many bits in the flash memory have flipped and detect radiation exposure accordingly. In this regard, the radiation sensing application 442 may assume that errors detected by execution of the error correction instructions result from bit flips due to radiation exposure.

However, in some embodiments, it may be impossible or impractical for such functions to be performed, such as when error correction instructions 444 may not be bypassed or when information indicating correction of cell values is unavailable to the radiation sensing application 442. Thus, the error correction functionality may conceal bit values indicative of charge leakage read at a cell damaged by radiation. In this regard, changing of bit values as part of error correction may generally prevent radiation sensing application 442 from identifying cells in which oxide layer damage by radiation exposure has caused stored charge to leak, resulting in a change of the cell's stored bit value from logic zero to logic one (a "bit flip"). To overcome this problem, radiation sensing application 442 can sense radiation exposure using additional techniques as described below.

In some embodiments, the radiation sensing application 442 may be configured to detect high radiation exposure by noting bit flips that are present in data and comparing the number with a threshold indicative of radiation damage. This technique may be performed even when error correction for the data stored in memory has been performed. For example, device 10 may be capable of accurately performing error correction for data up to a threshold amount of bit flips (an "error correction threshold"). Error correction may not be performed for all bit flips if an amount of bit flips per kilobyte of data (or other unit of data) exceeds the error correction threshold associated with the particular resource of the device 10. The error correction threshold may be based on various information, such as based on an amount of redundancy data (e.g., Hamming codes, etc.).

As noted above, if a sufficient number of bit flips is present in a portion of data, it may be assumed that the cells storing the data have been damaged by sufficiently high amount of radiation exposure such that the error correction is incapable of correcting all of the bit flips or errors resulting from such exposure. When error correction has been performed, a threshold number of bit flips at which radiation sensing application 442 may assume radiation damage has occurred may be lower relative to a threshold that would be used when error correction is not employed or is disabled.

In some embodiments, the radiation sensing application 442 may be configured to assume that error correction was performed for a number of bit flips up to an error correction threshold. Thus, the number of errors actually detected by the radiation sensing application 442 is not the total number of errors but rather only the number of errors that exceed the threshold. As noted above, a number of bit flips observed may correspond to damage indicative of an amount, type or other aspect of radiation to which the device 10 has been exposed. A sufficiently high bit flip count that exceeds the error correction threshold may generally correspond to a number of bit flips that is indicative of a heavy radiation strike (e.g., high levels of radiation exposure). In this regard, radiation sensing application 442 may associate bit flips that exceed a threshold based on error correction with high levels of radiation.

In addition, radiation sensing application 442 may include instructions for detecting levels of radiation exposure even when a quantity of bit flips does not exceed the error correction threshold. The radiation sensing application 442 may be configured to detect cells damaged by radiation by testing performance of memory and comparing measured performance differences with expected performance values. In this regard, aspects of cell performance may indicate an extent to which a cell has been damaged by exposure to radiation. For example, the mobile device 10 may be exposed to a level of radiation that causes an insufficient quantity of bit flips to exceed the error correction threshold. In addition, the radiation sensing application 442 may estimate information about the radiation exposure such as dosage amount, length or duration of exposure, instances of exposure, or otherwise based on performance.

In some embodiments, a time required to perform operations at flash memory unit 202 such as read, write, or erase operations may be altered when cells of the flash memory unit 202 have been damaged by radiation. For example, the time required for processor 410 to perform a read request for a portion of memory unit 202 may change proportionally with regard to the number of errors detected in data. As the number of cells damaged by radiation increases, the number of bit flips occurring in data read from memory 202 also may increase. A length of time required for error correction instructions 444 to correct errors following a read request from processor 410 may change proportionally with the number of errors detected in data read from the memory 202. Thus, increased read time may be assumed to indicate that more errors (bit flips) are being corrected in the data by error correction instructions 444.

In some embodiments, the radiation sensing application 442 can measure a read time for a read request to be completed (e.g., for data values stored in memory 202 to returned) and compare the measured read time with an expected read time. The expected read time may be based on an approximate read time for the same flash memory cells that is indicative of the cells' performance when less damage from radiation exposure is present. The radiation sensing application 442 can compare the measured read time with the expected read time and, if the measured read time exceeds the expected read time, the radiation sensing application 442 may determine that the cells have been damaged by radiation exposure. In some embodiments, radiation sensing application 442 may perform the comparison described above using a read time value from a single read request, but in some embodiments, a plurality of read time values from multiple read requests may be used (e.g., approximately up to 500 read operations or more), and each individual time value, an average time value, maximum time value, or otherwise may be compared with an expected threshold for the time value for determining whether radiation exposure has occurred. As an example, the radiation sensing application 442 may sense that exposure to at least a threshold amount of radiation has occurred if the average read time for a large number of read operations (or other operations) exceeds a predefined threshold.

Note that, as described above, the radiation sensing application 442 may further estimate an amount of radiation exposure that damaged the cells, such as by noting a difference between the measured read time (or other measured parameter) and expected read time (or threshold). For example, a greater difference may indicate greater damage, thus indicating that more significant exposure to radiation has occurred at the memory cells. Such estimation may be performed based on a difference between any or various combinations of the comparisons described herein. The radiation sensing application 442 further may associate additional information with the determination that radiation exposure has occurred, such as location information, time of day, user information, generation of an exposure event including aggregated radiation exposure information, etc., as described in more detail above.

In some embodiments, radiation sensing application 442 also may perform various other operations at one or more flash memory cells to measure at least one performance parameter of the one or more cells and compare the measured performance parameter for each operation with expected performance parameters for the one or more cells. Examples of parameters of cell performance that may be measured can include various aspects of flash memory performance, but in some embodiments, radiation sensing application 442 may perform any or a combination of a read, write, or erase operation for one or more cells of flash memory unit 202. Expected values for various parameters of cell performance can be based on various levels of cell performance, but in some embodiments, expected values may generally be based on cell performance values indicative of performance of a cell when less damage from radiation exposure is present in the cell. In some embodiments, a plurality of expected performance values may be measured and compared with any or various combinations of expected performance values by the radiation sensing application 442 in order to detect damage caused by radiation exposure.

As an example of detection of radiation exposure by radiation sensing application 442 by measuring parameters of memory cell performance, radiation sensing application 442 may include instructions for performing a write operation at one or more cells of memory 202. The radiation sensing application 442 may measure a write time required to complete a write operation and compare the measured write time with an expected write time. The radiation sensing application 442 may determine that radiation exposure has occurred if the comparison of the write time with the expected write time indicates that damage from radiation exposure has occurred. In some embodiments, such an indication may be present if the write time does not exceed the expected write time, but in other embodiments, a determination that the write time exceeds the expected write time may be an indication that damage from radiation exposure has occurred. The comparison may be repeated for a desired number of cells, and for a desired number of write operations, similar to the techniques described above with regard to monitoring of read time operations. Further, similar techniques may be performed by radiation sensing application 442 by comparing measured time required to perform programming operations with expected programming time.

In some embodiments, radiation sensing application 442 may be configured to perform the radiation sensing techniques similar to those described above with regard to flash memory unit 202 using one or more additional flash memory units (not specifically shown in FIG. 4) in order to determine instantaneous exposure versus cumulative radiation exposure. For example, radiation sensing application 442 may be configured to reset bit values for cells in the one or more flash memory units periodically, such as after each instance in which radiation exposure has been identified using the techniques described above, while not resetting bit values of cells exhibiting bit flips to initial bit values in cells of the flash memory unit 202. In this regard, the radiation sensing application 442 may monitor aspects of each of the flash memory unit 202 and the one or more additional flash memory units to identify radiation exposure detected at a particular time (e.g., based on bit flips/altered cell performance of cells of the one or more additional flash memory units since the last reset of cells values to the initial value or measurement of cell performance) while tracking cumulative radiation exposure using the flash memory 202 (e.g., based on a cumulative number of bit flips/altered cell performance observed since monitoring of the memory unit 202 began). Such techniques may be performed at various times, such as in response to user input, response to detection of radiation exposure, determination that radiation exposure exceeds a threshold, or otherwise.

Note that there are various techniques that can be used to determine the time for an operation to complete. For example, when the radiation sensing application 442 initiates a memory operation, such as a read, write, or erase of cells in flash memory, the radiation sensing application 442 may cause the processor to submit a request for performing the operation (e.g., a read request, a write request, or an erase request) to the operating system 440, which sends the request to the memory unit 202 for completion. Once the memory unit 202 performs the requested operation, the memory unit 202 may return a message indicating that the operation has been completed, and the operating system 440 may inform the application 442 of such completion. For a read operation, the message received by the application 442 may include the data values read from the memory. When the radiation sensing application 442 receives a message indicating completion of the memory operation, the application 442 is aware that the operation has been completed. Thus, to measure the time of a memory operation, the radiation sensing application 442 may track the time from submission of the memory operation request by the application 442 to the time when the application 442 receives a notification from the memory unit 202 that the operation has been completed. In other embodiments, other techniques for measuring the duration of an operation are possible.

Figure 5:
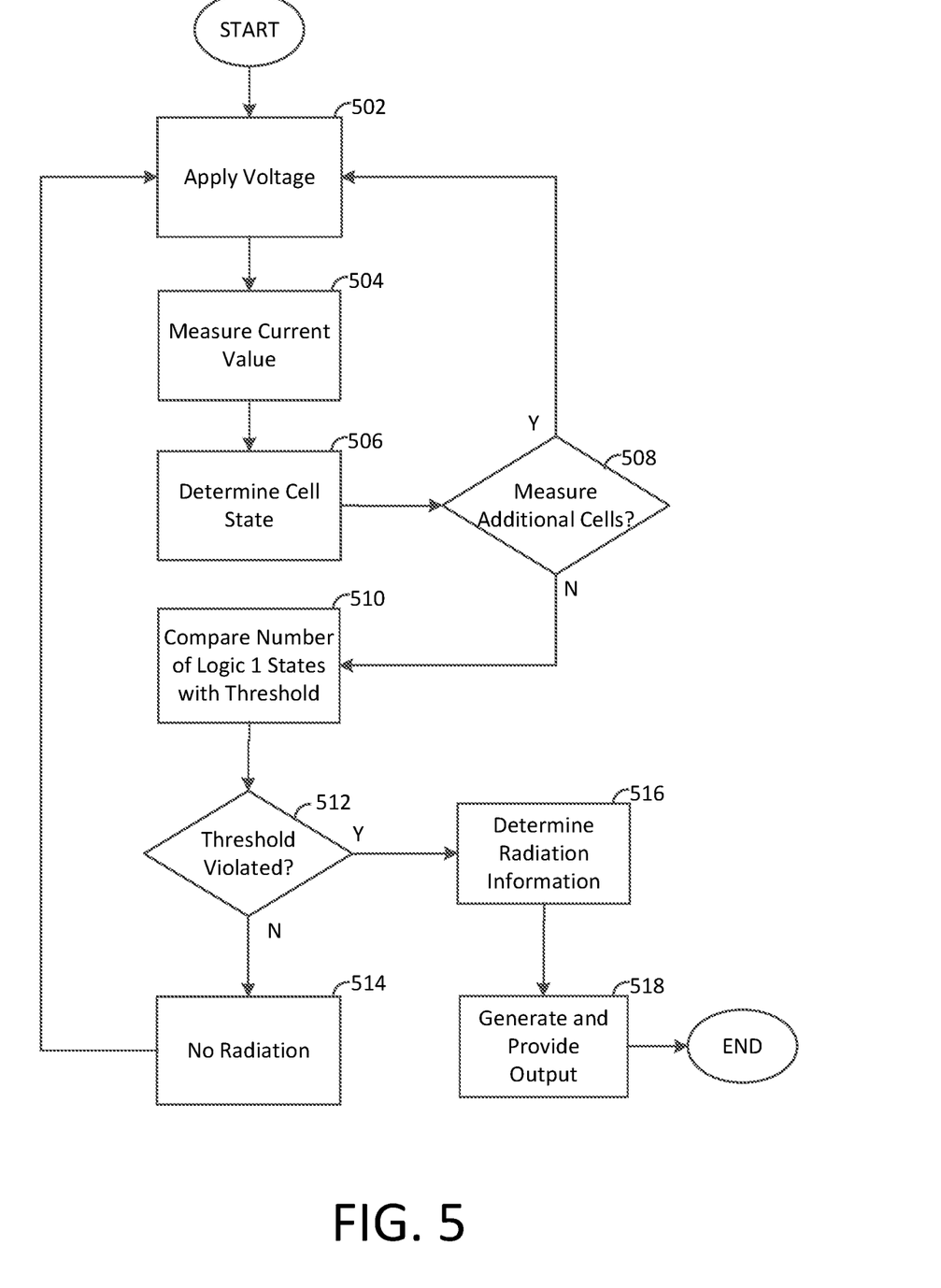
FIG. 5 is a flowchart illustrating an exemplary method for sensing radiation in accordance with some embodiments of the present disclosure.

FIG. 5 is a flowchart illustrating an exemplary method for sensing radiation in accordance with some embodiments of the present disclosure. For purposes of the method described below, it will be assumed that each of the states of the cells of a flash memory device have previously been charged (e.g., programmed to a bit value of logic 0), and that the flash memory unit is coupled for use with a mobile device as described herein.

Processing may begin at step 502, where voltage may be applied to one or more cells of a flash memory unit (e.g., at ground and word line terminals of the cell) to determine whether damage from radiation exposure has occurred. The voltage may be selected based on a desired operation for detecting radiation exposure, such as determining the state (e.g., binary bit values) of the cell. After voltage has been applied to the cell, processing may proceed to step 504 a current value or charge for the cell may be determined. After current has been measured for the cell, processing may proceed to step 506, where a state or binary bit value of the cell may be determined. The current value read when voltage is applied may be indicative of one or more states of the cell, such as whether the cell is programmed (e.g., logic 0) or erased (e.g., logic 1). As an example, if a current value of zero is measured, the state of the cell may be indicative that a corresponding state of the cell is programmed or logic 0. Conversely, if a current value above zero is measured, the current measurement may be indicative that a corresponding state of the cell is erased or a logical 1. After a bit value or state has been determined for the cell, processing may proceed to step 508.

In order to detect radiation exposure, determination of a bit value or state for a minimum number of cells may be required. At step 508, if additional bit values for the same or additional cells should be measured, processing may return to step 502, where a next bit value or state may be determined either for the same or another cell of the flash memory. If no additional bit values need to be determined processing may continue to step 510.

At step 510, an aggregate number of cells for which a current reading indicating that one or more states of the cell have "flipped" from programmed (e.g., logic 0) to erased (e.g., logic 1) may be compared with a threshold. When the number of bit flips exceeds or violates the threshold, a determination may be made that the number of bit flips is indicative of radiation damage, and the degree to which the number of bit flips exceeds the threshold may be indicative of the duration, type and severity of the radiation dose. If the threshold has not been violated, processing may return to step 502, where additional monitoring may occur. If the threshold has been violated, processing may continue to step 516, where information about the type of radiation exposure indicated by the comparison at 510 may be associated with the detected damage. Exemplary information may include the duration, type and severity of the radiation dose as well as approximate location information where the radiation dose occurred. Other information may be determined in other embodiments. Once the information has been determined, processing may continue to step 518, where an output indicative of the information may be generated and provided to a user, such as via a GUI displayed on a screen of a mobile device. The output may be generated and provided to a user via other techniques in other embodiments. Thereafter, processing may end.

Figure 6:
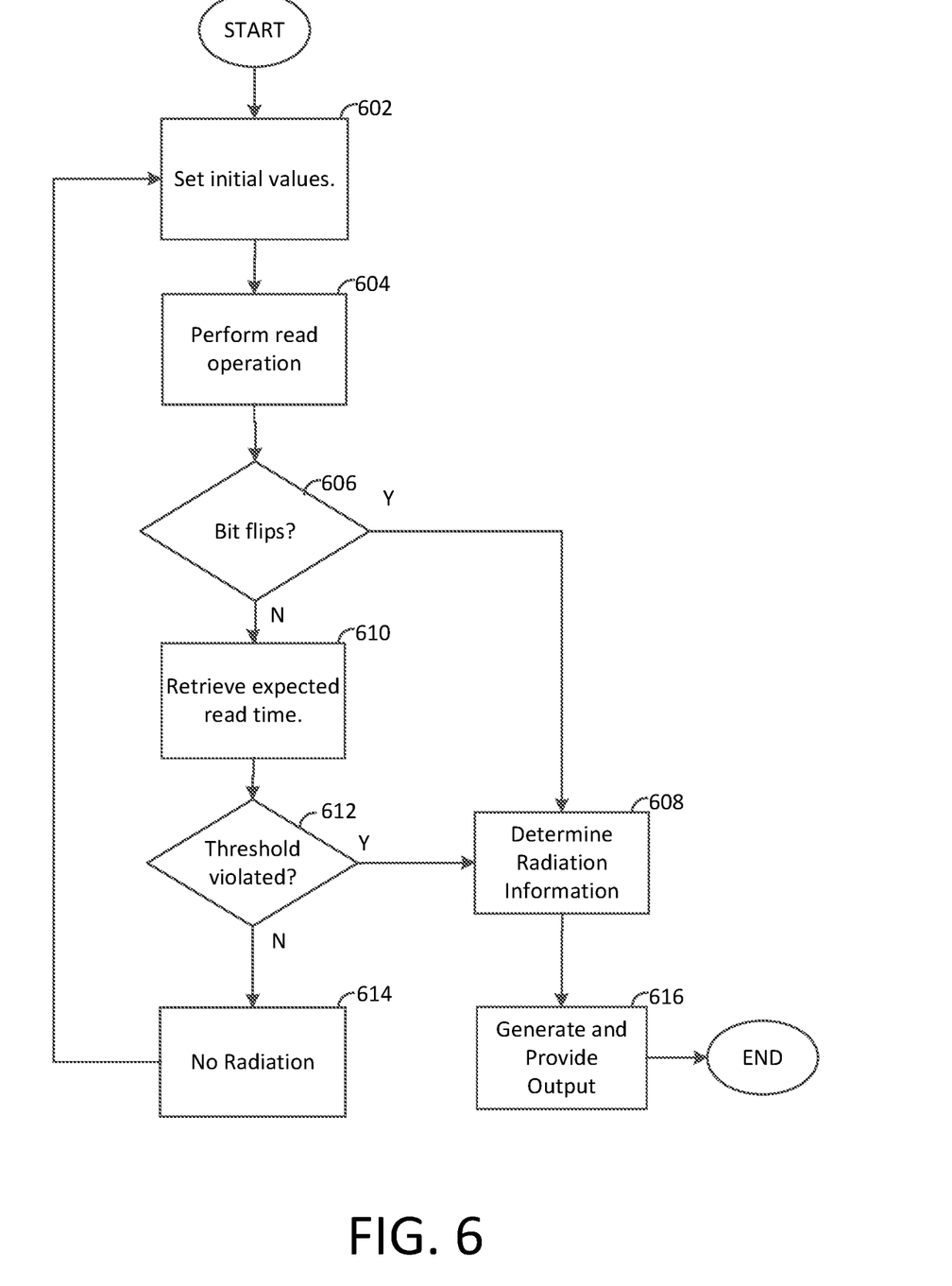
FIG. 6 is a flowchart illustrating an exemplary method for sensing radiation in accordance with some embodiments of the present disclosure.

FIG. 6 is a flowchart illustrating an exemplary method for sensing radiation in accordance with some embodiments of the present disclosure. Radiation sensing application 442 may be configured to identify damage to cells of flash memory unit 202 caused by radiation exposure, even when some bit flip values have been corrected, such as by error correction instructions 444. At step 602, radiation sensing application 442 may set data bit values for cells of a portion of flash memory unit 202 to an initial value (e.g., programmed or logic zero). Processing then may proceed to step 604.

At step 604 radiation sensing application 442 may perform a read operation for the portion of memory unit 202 set to the initial value. Simultaneously, the radiation sensing application 442 may measure a time required to complete the read operation. Then, at step 606, the radiation sensing application 442 may determine whether any bit flips are indicated by bit values in data returned as a result of the read operation. Note that error correction may be performed for the data (e.g., by error correction instructions 444) before the data is provided to the radiation sensing application 442. If radiation sensing application 442 determines that bit flips are present in the data, processing may proceed to step 608, where information about radiation exposure (e.g., intensity, duration, etc.) that caused the damage indicated by the bit flips may be determined, and additional information (e.g., location information, user information, time information, etc.) may be associated with the data. If radiation sensing application 442 determines that bit flips are not present in the data, processing may proceed to step 610, where the radiation sensing application may retrieve an expected read time for the read operation performed at step 604. Thereafter, processing may proceed to step 612.

At step 612, the radiation sensing application 442 may compare the measured read time with the expected read time to determine whether the comparison indicates that a threshold has been violated (e.g., that the measured read time exceeds the expected read time). If the threshold has not been violated, the radiation sensing application 442 may determine that the data indicates that no damage indicative of radiation exposure is present, and therefore no radiation exposure has occurred, and processing may return to step 602. If the threshold has been violated, processing may proceed to step 608, where additional information may be determined as described above. Then, processing may proceed to step 616, where an output indicative of the information may be generated and provided to a user. Thereafter, processing may end.

The foregoing is merely illustrative of the principles of this disclosure and various modifications may be made by those skilled in the art without departing from the scope of this disclosure. The above described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following claims.

As a further example, variations of apparatus or process parameters (e.g., dimensions, configurations, components, process step order, etc.) may be made to further optimize the provided structures, devices and methods, as shown and described herein. In any event, the structures and devices, as well as the associated methods, described herein have many applications. Therefore, the disclosed subject matter should not be limited to any single embodiment described herein, but rather should be construed in breadth and scope in accordance with the appended claims.

Now, therefore, the following is claimed:

1. A device for sensing radiation, comprising:
   flash memory; and
   at least one processor configured to perform at least one memory operation on the flash memory and to determine a value indicative of an amount of current that flows across a cell during a standby period between consecutive memory operations on the cell, the at least one processor configured to compare the value to a threshold and to determine whether the device has been exposed to at least a threshold level of radiation based on comparison of the value to the threshold, the at least one processor further configured to provide an output based on whether the device has been determined to be exposed to at least the threshold level of radiation.

2. The device of claim 1, wherein the at least one memory operation includes a read operation.

3. The device of claim 1, wherein the at least one memory operation includes a write operation.

4. The device of claim 1, wherein the at least one memory operation includes an erase operation.

5. The device of claim 1, wherein the device is a smartphone.

6. A device for sensing radiation, comprising:
   flash memory; and
   at least one processor configured to perform at least one memory operation on the flash memory and to determine a value indicative of an amount of current that flows across a cell during a standby period between consecutive memory operations on the cell, the at least one processor further configured to estimate an amount of radiation exposure for the device based on the value and to provide an output indicative of the estimated amount of radiation exposure.

7. The device of claim 6, wherein the at least one memory operation includes a read operation.

8. The device of claim 6, wherein the at least one memory operation includes a write operation.

9. The device of claim 6, wherein the at least one memory operation includes an erase operation.

10. The device of claim 6, wherein the at least one processor is configured to compare the value to a threshold.

11. The device of claim 6, wherein the device is a smartphone.

12. A method for use in a device, comprising
    performing at least one memory operation on flash memory within the device;
    determining with at least one processor of the device a value indicative of an amount of current that flows across a cell during a standby period between consecutive memory operations on the cell;
    determining an amount of radiation exposure for the device based on the value; and
    providing an output indicative of the determined amount of radiation exposure.

13. The method of claim 12, wherein the performing comprises reading the flash memory.

14. The method of claim 12, wherein the performing comprises writing to the flash memory.

15. The method of claim 12, wherein the performing comprises erasing the flash memory.

16. The method of claim 12, further comprising comparing the value to a threshold, wherein the determining the amount of radiation exposure is based on the comparing.

17. The method of claim 12, wherein the device is a smartphone.

* * * * *